United States Patent
Gaynor (10) Patent No.: US 9,728,013 B2
(45) Date of Patent: Aug. 8, 2017

(54) ENGINE DETECTION

(71) Applicant: Navico Holding AS, Egersund (NO)

(72) Inventor: Phillip King Gaynor, Pocasset, MA (US)

(73) Assignee: NAVICO HOLDING AS, Egersund (NO)

( * ) Notice: Subject to any disclaimer, the term of this patent is extended or adjusted under 35 U.S.C. 154(b) by 75 days.

(21) Appl. No.: 14/612,925

(22) Filed: Feb. 3, 2015

(65) Prior Publication Data

US 2016/0225195 A1   Aug. 4, 2016

(51) Int. Cl.
G01M 17/00 (2006.01)
G07C 1/02 (2006.01)
G01R 31/00 (2006.01)
G07C 5/08 (2006.01)

(52) U.S. Cl.
CPC .............. *G07C 1/02* (2013.01); *G01R 31/001* (2013.01); *G07C 5/0858* (2013.01)

(58) Field of Classification Search
CPC .......... G07C 1/02; G07C 5/006; G07C 5/008; G07C 5/085; G01R 31/001; G06F 17/40; G06Q 10/06; B64F 5/0045
USPC .... 701/29.4, 34.4; 364/424.06, 424.03, 550; 340/425.5, 438; 702/182
See application file for complete search history.

(56) References Cited

U.S. PATENT DOCUMENTS

| | | | | |
|---|---|---|---|---|
| 5,043,727 A * | 8/1991 | Ito | ............................ | B63J 99/00 340/438 |
| 5,204,991 A * | 4/1993 | Law | ...................... | H02J 7/0063 307/10.7 |
| 5,552,987 A * | 9/1996 | Barger | ...................... | G07C 3/04 340/971 |
| 5,928,040 A * | 7/1999 | Wharton | ................. | B63B 49/00 440/1 |
| 6,816,728 B2 * | 11/2004 | Igloi | ......................... | G06F 8/60 455/11.1 |
| 6,909,946 B1 * | 6/2005 | Kabel | ................. | H04W 84/005 340/984 |
| 7,047,114 B1 * | 5/2006 | Rogers | ...................... | G08G 3/02 340/438 |
| 7,577,520 B2 * | 8/2009 | Nomura | .................. | G01C 21/32 340/990 |
| 8,185,254 B2 * | 5/2012 | Brinkman | .............. | G01C 21/20 370/238 |
| 8,970,396 B1 * | 3/2015 | Nohra | .................. | G08B 21/182 340/457.4 |
| 2001/0049579 A1 * | 12/2001 | Fujino | ................... | G01M 15/04 701/114 |

(Continued)

*Primary Examiner* — Shardul Patel
(74) *Attorney, Agent, or Firm* — Nelson Mullins Riley & Scarborough LLP (57) ABSTRACT

Various implementations described herein are directed to a non-transitory computer readable medium having stored thereon computer-executable instructions which, when executed by a computer, may cause the computer to detect electrical noise corresponding to one or more engines starting or running. The computer may record a first timestamp corresponding to the engines starting or running. The computer may detect that the engines have stopped. The computer may record a second timestamp corresponding to the engines stopping. The computer may also use the first and second timestamps to determine engine runtimes.

20 Claims, 5 Drawing Sheets

(56) References Cited

U.S. PATENT DOCUMENTS

| | | | | |
|---|---|---|---|---|
| 2004/0002798 A1* | 1/2004 | Simons | .................. | G06Q 10/06 |
| | | | | 702/184 |
| 2008/0270074 A1* | 10/2008 | Horkavi | ................. | G07C 5/008 |
| | | | | 702/182 |
| 2009/0048726 A1* | 2/2009 | Lofall | .................... | B63H 21/12 |
| | | | | 701/21 |
| 2009/0322510 A1* | 12/2009 | Berger | .................. | H04W 60/00 |
| | | | | 340/539.1 |
| 2012/0253548 A1* | 10/2012 | Davidson | ............... | G06Q 10/08 |
| | | | | 701/1 |
| 2012/0262283 A1* | 10/2012 | Biondo | .................. | G07C 5/085 |
| | | | | 340/425.5 |
| 2013/0197728 A1* | 8/2013 | Blackwood | ............... | G01L 3/26 |
| | | | | 701/21 |
| 2015/0233998 A1* | 8/2015 | Chen | .................... | G01R 31/086 |
| | | | | 324/764.01 |
| 2016/0104328 A1* | 4/2016 | Chen | ...................... | G07C 5/008 |
| | | | | 701/31.5 |

\* cited by examiner

ENGINE DETECTION

BACKGROUND

This section is intended to provide background information to facilitate a better understanding of various technologies described herein. As the section's title implies, this is a discussion of related art. That such art is related in no way implies that it is prior art. The related art may or may not be prior art. It should therefore be understood that the statements in this section are to be read in this light, and not as admissions of prior art.

The amount of time an engine on a marine vessel has been running, referred to as engine hours, may be of interest to a vessel operator. The engine hours may be used to determine when engine maintenance should occur, for warranty purposes, or for other purposes. The engine on a vessel may be connected to a Direct Current (DC) electrical system on the vessel. The engine may charge a battery connected to the DC electrical system. For example, the engine may have an alternator that charges the battery.

SUMMARY

Described herein are implementations of various technologies for determining engine runtimes. In one implementation, a non-transitory computer-readable medium having stored thereon computer-executable instructions which, when executed by a computer, cause the computer to perform various actions. The actions may include detecting electrical noise corresponding to one or more engines starting or running. The actions may include recording a first timestamp corresponding to the engines starting or running. The actions may include detecting that the engines have stopped. The actions may include recording a second timestamp corresponding to the engines stopping. The actions may also include using the first and second timestamps to determine engine runtimes.

Described herein are implementations of various technologies for an apparatus for displaying marine electronic data. The device includes one or more processors, a screen configured to display marine data, and a memory. The memory has a plurality of executable instructions. When the executable instructions are executed by the one or more processors, the processors may detect electrical noise corresponding to one or more engines starting or running. The processors may record a first timestamp corresponding to the engines starting or running. The processors may detect that the engines have stopped. The processors may record a second timestamp corresponding to the engines stopping. The processors may also use the first and second timestamps to determine engine runtimes.

Described herein are also implementations of various technologies for a method for detecting engine hours. The method may include detecting electrical noise corresponding to an engine running. The engine is connected to a direct current (DC) electrical system and the electrical noise is detected by a computerized device connected to the electrical system. The method may include monitoring the electrical noise to determine the amount of time that the engine is running. The method may also include storing a record, on a computerized device, of the amount of time that the engine is running.

The above referenced summary section is provided to introduce a selection of concepts in a simplified form that are further described below in the detailed description section. The summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

Implementations of various techniques will hereafter be described with reference to the accompanying drawings. It should be understood, however, that the accompanying drawings illustrate only the various implementations described herein and are not meant to limit the scope of various techniques described herein.

DETAILED DESCRIPTION

Various implementations of engine detection described herein will now be described in more detail with reference to FIGS. 1-5.

Figure 1:
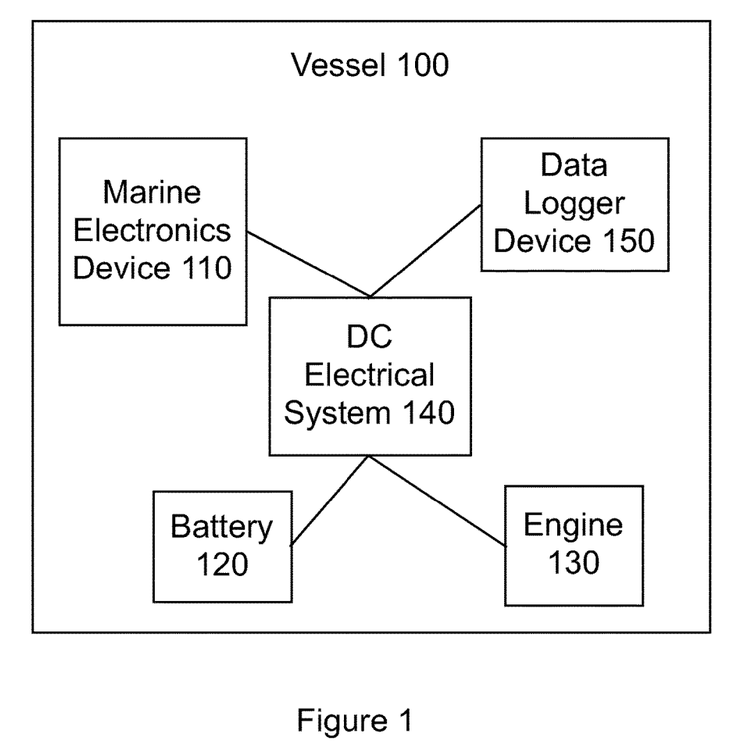
FIG. 1 illustrates a block diagram of a vessel in accordance with implementations of various techniques described herein.

FIG. 1 illustrates a block diagram of a vessel 100 in accordance with implementations of various techniques described herein. The vessel 100 may include one or more engines 130. An engine 130 may be a two-stroke engine, a four stroke engine, a diesel engine, or any other type of engine. The engine 130 may be connected to a DC electrical system 140. The engine 130 may charge a battery 120, which may also be connected to the DC electrical system 140. For example, the engine 130 may include an alternator that charges the battery 120. The DC electrical system 140 may be used to supply electricity to a portion of or all electrical equipment on a vessel 100. The DC electrical system 140 may comprise electrical wiring, cables, or other electrical components. The DC electrical system 140 may be a 12, 24, or 36 volt system. The DC electrical system 140 may also be connected to a marine electronics device 110, which is further described in more detail in FIG. 4. In addition to or instead of a marine electronics device 110, a gauge, data logger device 150, or any other electrical device may be connected to the DC electrical system 140. The data logger device 150 may record data and then transfer the data to a computer system or cloud software service.

The engine 130 may emit electrical noise, also known as electromagnetic interference (EMI), that is detectable by any device connected to the DC electrical system 140. For example, a microprocessor in a device connected to the DC electrical system 140 may detect electrical noise emitted by an engine. In one implementation, the electrical noise may be detected and then filtered so that the electrical noise does not interfere with electronic systems on the vessel. For example, a marine electronics device 110 may filter electrical noise so that the noise does not interfere with a microprocessor in the marine electronics device 110.

Figure 2:
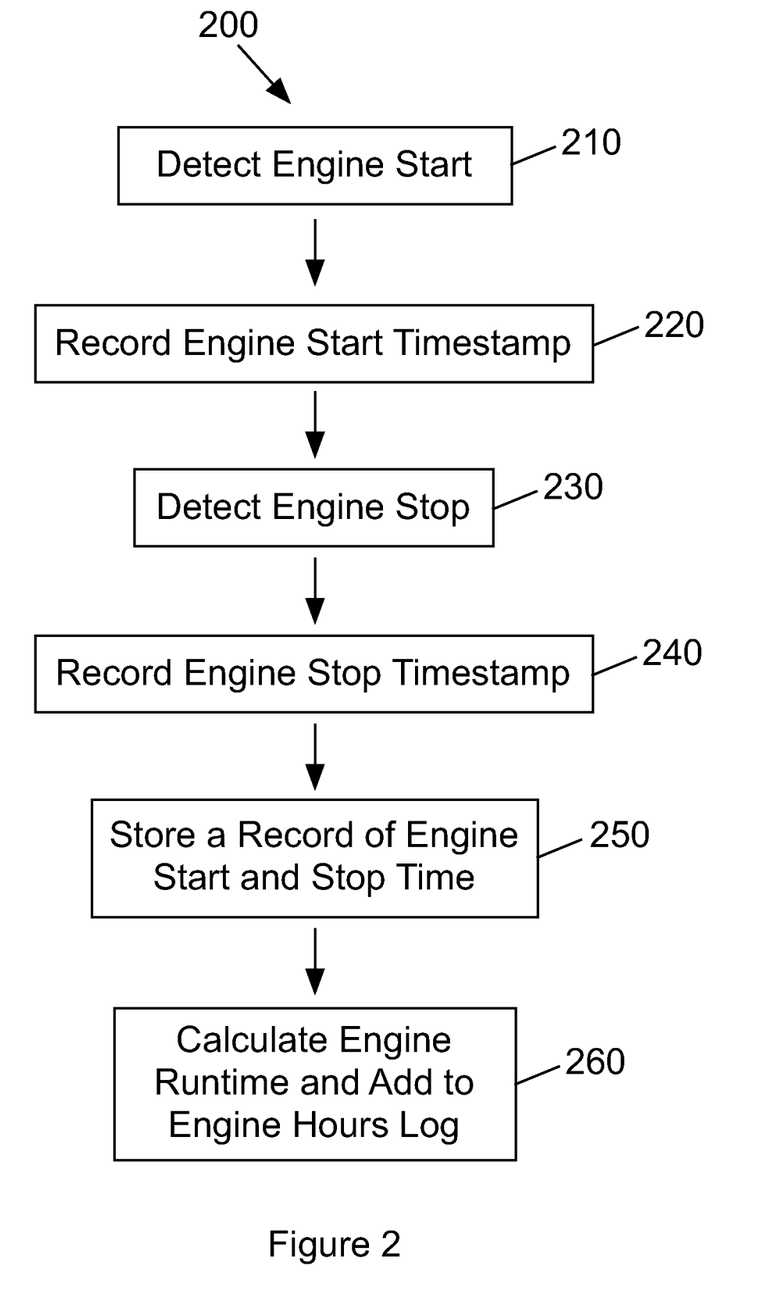
FIG. 2 is a flow diagram for a method of detecting a running engine in accordance with implementations of various techniques described herein.

FIG. 2 is a flow diagram for a method of detecting a running engine in accordance with implementations of various techniques described herein. In one implementation, method 200 may be performed by any computer system 400, including a gauge, a data logger, the marine electronics device 110, and the like. It should be understood that while method 200 indicates a particular order of execution of operations, in some implementations, certain portions of the operations might be executed in a different order, and on different systems. Further, in some implementations, additional operations or steps may be added to the method 200. Likewise, some operations or steps may be omitted.

At block 210, the method 200 may detect an engine starting or running. A starting or running engine may be detected by analyzing electrical noise detected by an electronic device connected to a DC electrical system on a vessel. The electrical noise may also be analyzed to determine the type of engine, number of engines, revolutions per minute (RPM) of the engine, whether the engine is idling, or other information about the engine. For example, the frequency of the electrical noise emitted by the engine may be analyzed to determine the RPMs of the engine.

At block 220, a timestamp may be recorded corresponding to the start time of the engine. The timestamp may include a date. In one implementation, the timestamp may be stored in a record on a marine electronics device 500 or computer system 400. In another implementation, the timestamp may be transmitted to a cloud software service.

At block 230, the method 200 may detect that an engine has stopped running. For example, the method 200 may monitor electrical noise on the DC electrical system to detect that noise corresponding to an engine is no longer being emitted.

At block 240, a timestamp may be recorded corresponding to the time when the engine stopped running. As mentioned above, the timestamp may be stored in a record on a marine electronics device 500 or computer system 400, or transmitted to a cloud software service.

At block 250, a record describing the engine start and stop time may be stored. The record may include the timestamps recorded at block 220 and 240. The record may be stored on a computer system 400. The record may be transmitted to a cloud software service. In one implementation, the method 200 may monitor electrical noise emitted by an engine to determine time periods where the engine is running and time periods where the engine is idling. In this implementation, a record may be stored describing the time periods in which the engine was running and the time periods in which the engine was idling.

At block 260, the engine runtime may be calculated and added to an engine hours log. The engine runtime may be calculated by subtracting the timestamp recorded at block 240 from the timestamp recorded at block 220. The engine hours log may record the total number of hours that an engine has been running. The runtime recorded in the engine hours log may be used to determine maintenance intervals, maintenance triggers, for insurance purposes, or for other uses.

Other engine information may be detected and recorded as well, such as RPMs, the number of engines running, approximate speed, whether an engine is in idle, or a spectrum of power uses. If multiple engines are used, a frequency signature corresponding to an individual engine may be detected and used to separate data from the multiple engines. For example, if two engines are present, a first frequency signature may be detected corresponding to the first engine, a second frequency signature may be detected corresponding to the second engine, and the frequency signatures may be used to detect engine hours for the individual engines.

In one implementation, method 200 may determine that an engine has started or stopped by detecting airborne noise as an alternative to electrical noise on the DC electrical system, or by detecting both airborne noise and electrical noise on the DC electrical system. The airborne noise may be EMI traveling through the air that is emitted by an engine.

Timestamps recorded at blocks 220 and 240 may be used to calculate engine runtime statistics, such as the engine runtime per week or month. In one implementation, the timestamps may be uploaded to a cloud software service, and the cloud software service may then calculate the runtime statistics.

Figure 5:
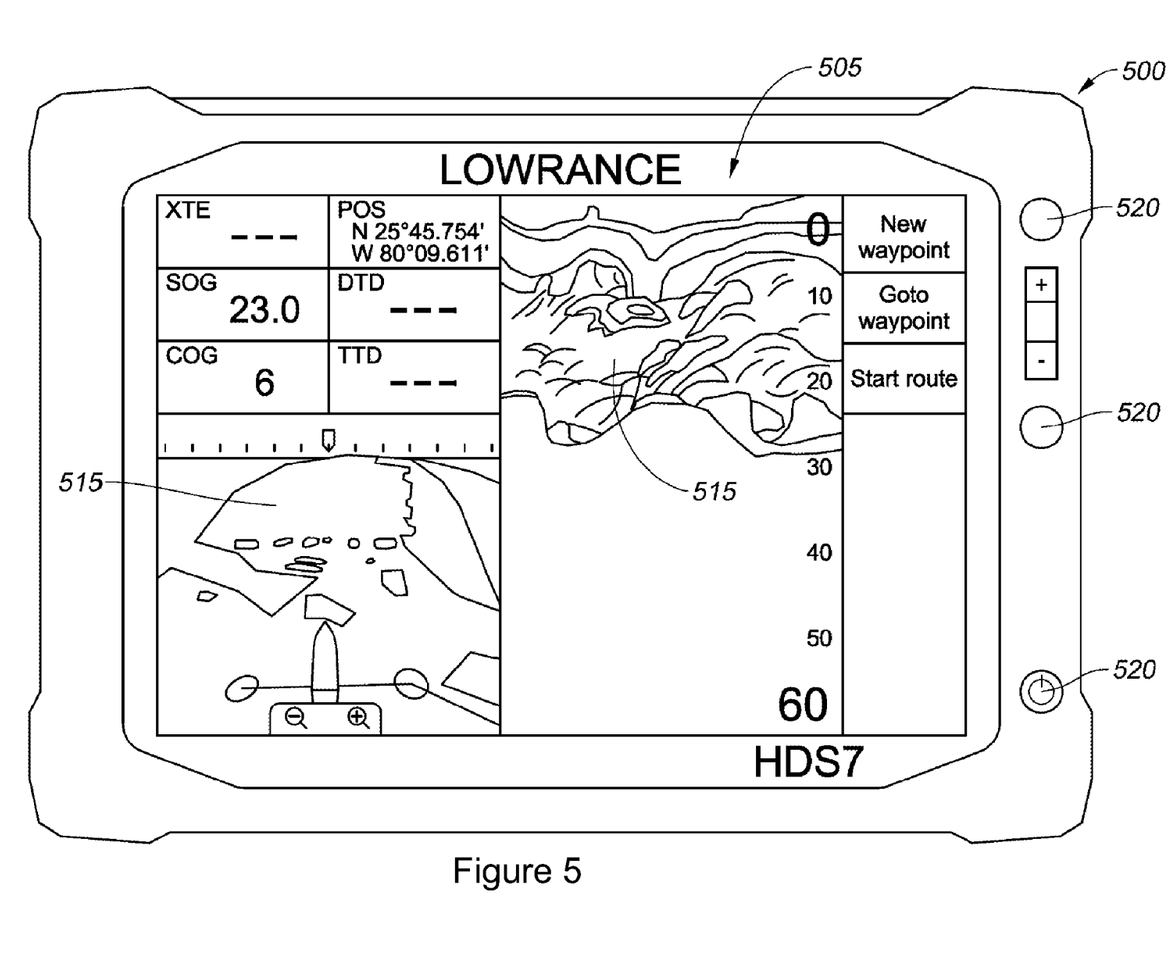
FIG. 5 illustrates a schematic of a marine electronics device in accordance with implementations of various techniques described herein.

Electronic devices, such as the marine electronics device described in FIG. 5, may include filtering hardware or software capable of reducing or removing the effects of electrical noise. In order for method 200 to function properly, electrical noise filters may need to be deactivated, bypassed, or modified in order to detect engine noise on a DC electrical system.

Figure 3:
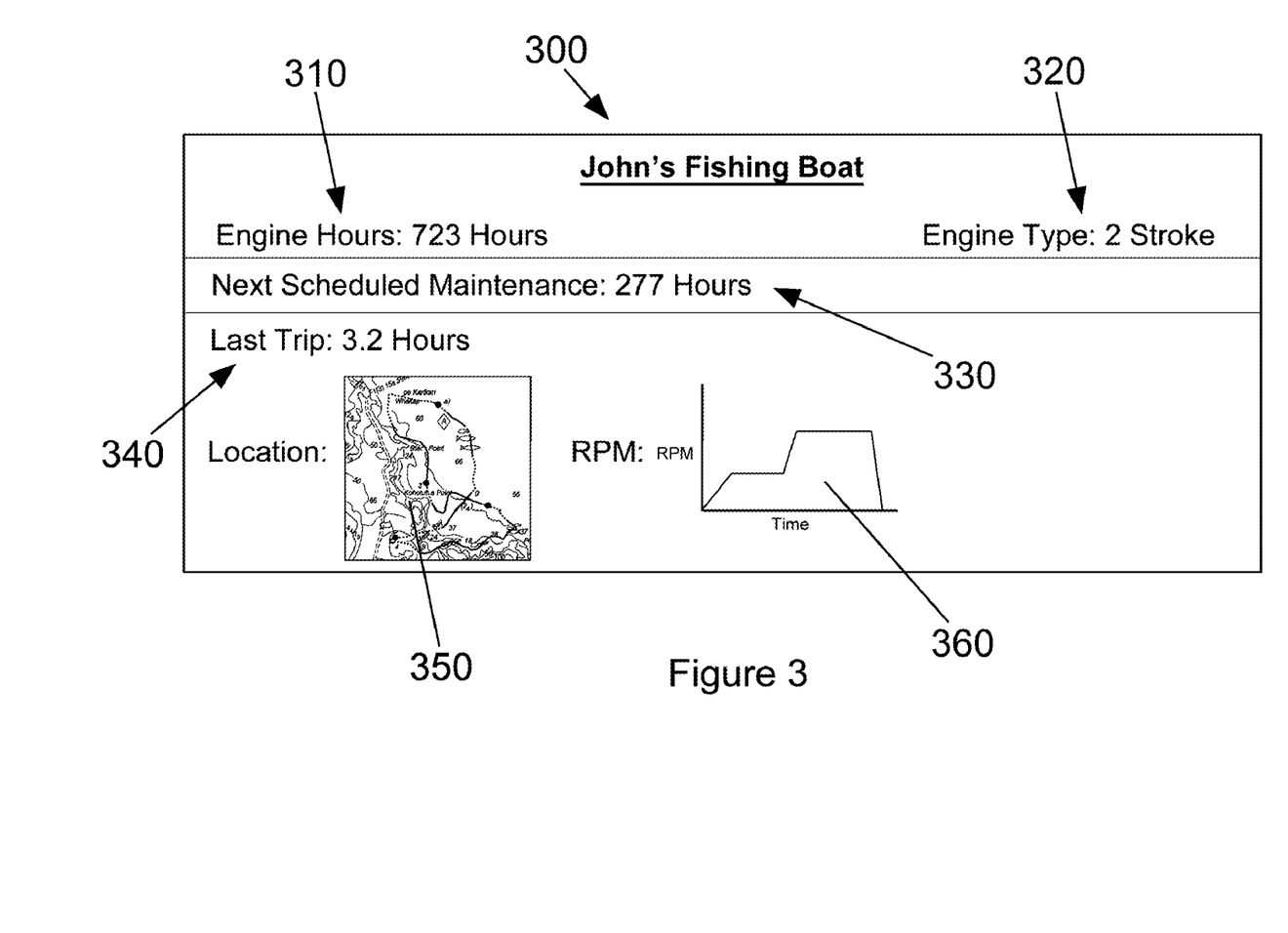
FIG. 3 illustrates an engine hours display in accordance with implementations of various techniques described herein.

FIG. 3 illustrates an engine hours display 300 in accordance with implementations of various techniques described herein. The engine hours display 300 may display data recorded using method 200. In one implementation, the engine hours display 300 may be displayed by a marine electronics device 500, a gauge, a smart device, such as a smartphone, or any other electronic device on a vessel. In another implementation, the engine hours display 300 may be generated by a cloud software service and displayed using any computer system 400. For example, a user may be able to view the engine hours of a vessel while using their home computer.

The engine hours display 300 may display a total number of engine hours 310. The total number of engine hours 310 may be determined by monitoring engine activity using method 200. The display 300 may also indicate an engine type 320, which may be determined by detecting electrical noise as described in method 200. The engine type 320 may also be input or selected manually.

At 330, warnings such as next scheduled maintenance are displayed. The warnings may be calculated using the total number of engine hours 310. Information about the last trip may be displayed on the display 300. The duration of the last trip 340 may be calculated using data recorded by method 200. A map 350 may be displayed to indicate the location of the last trip. The location may be determined using a Global Positioning System (GPS). An RPM chart 360 corresponding to the last trip may be displayed on the display 300. The RPM chart 360 may show changes in RPMs that occurred during the trip.

Computing System

Implementations of various technologies described herein may be operational with numerous general purpose or special purpose computing system environments or configurations. Examples of well-known computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Generally, program modules include routines, programs, objects, components, data structures, etc. that performs particular tasks or implement particular abstract data types. Further, each program module may be implemented in its own way, and all need not be implemented the same way. While program modules may all execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or both.

The various technologies described herein may be implemented in the context of marine electronics, such as devices found in marine vessels and/or navigation systems. Ship instruments and equipment may be connected to the computing systems described herein for executing one or more navigation technologies. As such, the computing systems may be configured to operate using sonar, radar, GPS and like technologies.

The various technologies described herein may also be implemented in distributed computing environments where tasks are performed by remote processing devices that are linked through a communications network, e.g., by hard-wired links, wireless links, or combinations thereof. In a distributed computing environment, program modules may be located in both local and remote computer storage media including memory storage devices.

Figure 4:
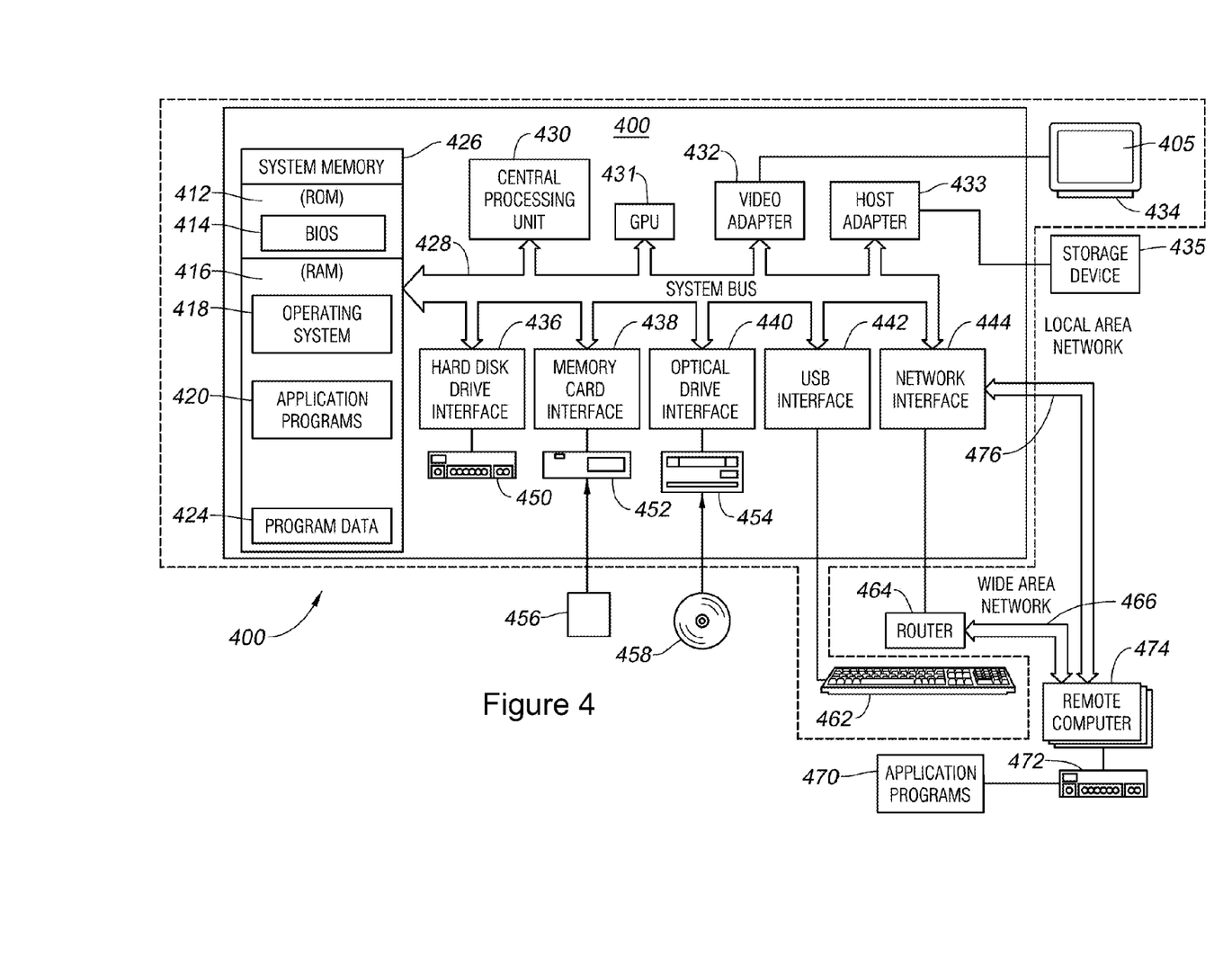
FIG. 4 illustrates a schematic diagram of a computing system in which the various technologies described herein may be incorporated and practiced.

FIG. 4 illustrates a computer system 400 into which implementations of various technologies and techniques described herein may be implemented. Computing system 400 may be a conventional desktop, a handheld device, a wearable device, a controller, a personal digital assistant, a server computer, an electronic device/instrument, a laptop, a tablet, or part of a navigation system, marine electronics, or sonar system. It should be noted, however, that other computer system configurations may be used.

The computing system 400 may include a central processing unit (CPU) 430, a system memory 426 and a system bus 428 that couples various system components including the system memory 426 to the CPU 430. Although only one CPU 430 is illustrated in FIG. 4, it should be understood that in some implementations the computing system 400 may include more than one CPU 430.

The CPU 430 can include a microprocessor, a microcontroller, a processor, a programmable integrated circuit, or a combination thereof. The CPU 430 can comprise an off-the-shelf processor such as a Reduced Instruction Set Computer (RISC), including an Advanced RISC Machine (ARM) processor, or a Microprocessor without Interlocked Pipeline Stages (MIPS) processor, or a combination thereof. The CPU 430 may also include a proprietary processor. The CPU may include a multi-core processor.

The CPU 430 may provide output data to a Graphics Processing Unit (GPU) 431. The GPU 431 may generate graphical user interfaces that present the output data. The GPU 431 may also provide objects, such as menus, in the graphical user interface. A user may provide inputs by interacting with the objects. The GPU 431 may receive the inputs from interaction with the objects and provide the inputs to the CPU 430. In one implementation, the CPU 430 may perform the tasks of the GPU 431. A video adapter 432 may be provided to convert graphical data into signals for a monitor 434. The monitor 434 includes a screen 405. The screen 405 can be sensitive to heat or touching (now collectively referred to as a "touch screen"). In one implementation, the computer system 400 may not include a monitor 434.

The GPU 431 may be a microprocessor specifically designed to manipulate and implement computer graphics. The CPU 430 may offload work to the GPU 431. The GPU 431 may have its own graphics memory, and/or may have access to a portion of the system memory 426. As with the CPU 430, the GPU 431 may include one or more processing units, and each processing unit may include one or more cores.

The system bus 428 may be any of several types of bus structures, including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus. The system memory 426 may include a read only memory (ROM) 412 and a random access memory (RAM) 416. A basic input/output system (BIOS) 414, containing the basic routines that help transfer information between elements within the computing system 400, such as during start-up, may be stored in the ROM 412. The computing system may be implemented using a printed circuit board containing various components including processing units, data storage memory, and connectors.

Certain implementations may be configured to be connected to a GPS and/or a sonar system. The GPS and/or sonar system may be connected via the network interface 444 or Universal Serial Bus (USB) interface 442. In one implementation, the computing system 400, the monitor 434, the screen 405 and buttons may be integrated into a console.

The computing system 400 may further include a hard disk drive 436 for reading from and writing to a hard disk 450, a memory card reader 452 for reading from and writing to a removable memory card 456 and an optical disk drive 454 for reading from and writing to a removable optical disk 458, such as a CD ROM, DVD ROM or other optical media. The hard disk drive 450, the memory card reader 452 and the optical disk drive 454 may be connected to the system bus 428 by a hard disk drive interface 436, a memory card interface 438 and an optical drive interface 440, respectively. The drives and their associated computer-readable media may provide nonvolatile storage of computer-readable instructions, data structures, program modules and other data for the computing system 400.

Although the computing system 400 is described herein as having a hard disk 450, a removable memory card 456 and a removable optical disk 458, it should be appreciated by those skilled in the art that the computing system 400 may also include other types of computer-readable media that may be accessed by a computer. For example, such computer-readable media may include computer storage media and communication media. Computer storage media may include volatile and non-volatile, and removable and non-removable media implemented in any method or technology for storage of information, such as computer-readable instructions, data structures, program modules or other data.

Computer storage media may further include RAM, ROM, erasable programmable read-only memory (EPROM), electrically erasable programmable read-only memory (EEPROM), flash memory or other solid state memory technology, including a Solid State Disk (SSD), CD-ROM, digital versatile disks (DVD), or other optical storage, magnetic cassettes, magnetic tape, magnetic disk storage or other magnetic storage devices, or any other medium which can be used to store the desired information and which can be accessed by the computing system 400. Communication media may embody computer readable instructions, data structures, program modules or other data in a modulated data signal, such as a carrier wave or other transport mechanism and may include any information delivery media. By way of example, and not limitation, communication media may include wired media such as a wired network or direct-wired connection, and wireless media such as acoustic, RF, infrared and other wireless media. The computing system 400 may also include a host adapter 433 that connects to a storage device 435 via a small computer system interface (SCSI) bus, a Fiber Channel bus, an eSATA bus, or using any other applicable computer bus interface. The computing system 400 can also be connected to a router 464 to establish a wide area network (WAN) 466 with one or more remote computers 474. The router 464 may be connected to the system bus 428 via a network interface 444. The remote computers 474 can also include hard disks 472 that store application programs 470.

In another implementation, the computing system 400 may also connect to one or more remote computers 474 via local area network (LAN) 476 or the WAN 466. When using a LAN networking environment, the computing system 400 may be connected to the LAN 476 through the network interface or adapter 444. The LAN 476 may be implemented via a wired connection or a wireless connection. The LAN 476 may be implemented using Wi-Fi technology, cellular technology, or any other implementation known to those skilled in the art. The network interface 444 may also utilize remote access technologies (e.g., Remote Access Service (RAS), Virtual Private Networking (VPN), Secure Socket Layer (SSL), Layer 2 Tunneling (L2T), or any other suitable protocol). These remote access technologies may be implemented in connection with the remote computers 474. It will be appreciated that the network connections shown are exemplary and other means of establishing a communications link between the computer systems may be used. The network interface 444 may also include digital cellular networks, Bluetooth, or any other wireless network interface.

A number of program modules may be stored on the hard disk 450, memory card 456, optical disk 458, ROM 412 or RAM 416, including an operating system 418, one or more application programs 420, program data 424 and a database system. The one or more application programs 420 may contain program instructions configured to perform method 200 according to various implementations described herein. The operating system 418 may be any suitable operating system that may control the operation of a networked personal or server computer, such as Windows® XP, Mac OS® X, Unix-variants (e.g., Linux® and BSD®), Android®, iOS®, and the like.

A user may enter commands and information into the computing system 400 through input devices such as a keyboard 462 and pointing device. Other input devices may include a microphone, joystick, game pad, satellite dish, scanner, user input button, wearable device, or the like. These and other input devices may be connected to the CPU 430 through a USB interface 442 coupled to system bus 428, but may be connected by other interfaces, such as a parallel port, Bluetooth or a game port. A monitor 405 or other type of display device may also be connected to system bus 428 via an interface, such as a video adapter 432. In addition to the monitor 434, the computing system 400 may further include other peripheral output devices such as speakers and printers.

Marine Electronics Device

FIG. 5 illustrates a schematic diagram of a marine electronics device 500 in accordance with various implementations described herein. The marine electronics device 500 includes a screen 505. In certain implementations, the screen 505 may be sensitive to touching by a finger. In other implementations, the screen 505 may be sensitive to the body heat from the finger, a stylus, or responsive to a mouse. The marine electronics device 500 may be attached to a National Marine Electronics Association (NMEA) bus or network. The marine electronics device 500 may send or receive data to or from another device attached to the NMEA 2000 bus. For example, the marine electronics device 500 may transmits commands and receive data from a motor or a sensor using an NMEA 2000 bus. The marine electronics device 500 may transmit or receive NMEA 2000 compliant messages, messages in a proprietary format that do not interfere with NMEA 2000 compliant messages or devices, or messages in any other format. The device 500 may display marine electronic data 515. The marine electronic data types 515 may include chart data, radar data, sonar data, steering data, dashboard data, navigation data, fishing data, engine data, and the like. The marine electronics device 500 may also include a plurality of buttons 520, which may be either physical buttons or virtual buttons, or a combination thereof. The marine electronics device 500 may receive input through a screen 505 sensitive to touch or buttons 520.

The marine electronics device 500 may receive electrical power through a DC electrical system on a marine vessel. The marine electronics device 500 may be capable of detecting electrical noise on the DC electrical system. For example, a microprocessor in the marine electronics device 500 may detect electrical noise emitted by an engine.

It is to be understood that the discussion above is only for the purpose of enabling a person with ordinary skill in the art to make and use any subject matter defined now or later by the patent "claims" found in any issued patent herein.

It is specifically intended that the claimed invention not be limited to the implementations and illustrations contained herein, but include modified forms of those implementations including portions of the implementations and combinations of elements of different implementations as come within the scope of the following claims. Nothing in this application is considered critical or essential to the claimed invention unless explicitly indicated as being "critical" or "essential."

Reference has been made in detail to various implementations, examples of which are illustrated in the accompanying drawings and figures. In the detailed description, numerous specific details are set forth in order to provide a thorough understanding of the present disclosure. However, it should be apparent to one of ordinary skill in the art that the present disclosure may be practiced without these specific details. In other instances, well-known methods, procedures, components, circuits and networks have not been described in detail so as not to unnecessarily obscure aspects of the implementations.

It will also be understood that, although the terms first, second, etc. may be used herein to describe various elements, these elements should not be limited by these terms.

These terms are only used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description of the present disclosure herein is for the purpose of describing particular implementations only and is not intended to be limiting of the present disclosure. As used in the description of the present disclosure and the appended claims, the singular forms "a," "an" and "the" are intended to include the plural forms as well, unless the context clearly indicates otherwise. It should also be understood that the term "and/or" as used herein refers to and encompasses any and all possible combinations of one or more of the associated listed items. It should be further understood that the terms "includes," "including," "comprises" and/or "comprising," when used in this specification, specify the presence of stated features, integers, steps, operations, elements, and/or components, but should not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

"Alternatively" should not be construed to only pertain to situations where the number of choices involved is exactly two, but rather refers to another possibility among many other possibilities.

Additionally, various technologies and techniques described herein include receiving user requests for a number of different operations. In certain instances, the user request for a particular operation will be explicitly described. It should be understood that a "request" or "can request" can also include, but are not limited to, touching a screen, double tapping a screen (tapping the screen twice in rapid succession), pressing a particular physical or virtual button, making a selection from a menu, swiping the screen (placing a finger towards an edge of the screen and traversing the screen while maintaining contact between the finger and the screen) placement of a cursor at a particular location, stylus pointing, mouse selection, an audible command, as well as the explicit description of the "request" for the particular operations.

While the foregoing is directed to implementations of various techniques described herein, other and further implementations may be devised without departing from the basic scope thereof, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-transitory computer-readable medium having stored thereon a plurality of computer-executable instructions which, when executed by a computer, cause the computer to:
   detect, by an electronic device monitoring an electrical system, electrical noise emitted onto the electrical system via an electrical connection to the electrical system by one or more engines, the electrical noise corresponding to the one or more engines starting or running;
   record a first timestamp corresponding to the one or more engines starting or running in response to the detection of the electrical noise;
   analyze, by the electronic device monitoring the electrical system, the electrical noise emitted by one of the one or more engines to determine a revolutions per minute (RPM) corresponding to the one engine;
   store a record describing the RPM of the one engine while the one engine is running;
   detect, by the electronic device monitoring the electrical system, an absence of the electrical noise on the electrical system indicating that the one or more engines have stopped;
   record a second timestamp corresponding to the one or more engines stopping in response to the detection of the absence of the electrical noise on the electrical system; and
   determine an engine runtimes based on the first and second timestamps.

2. The non-transitory computer-readable medium of claim 1, wherein the computer-executable instructions that cause the computer to detect the electrical noise comprise computer-executable instructions that cause the computer to detect the electrical noise, wherein the electrical noise is electromagnetic interference introduced to the electrical system by the one or more engines.

3. The non-transitory computer-readable medium of claim 1, wherein the computer-executable instructions further cause the computer to:
   retrieve a total engine hours value; and
   add an engine runtime to the total engine hours value.

4. The non-transitory computer-readable medium of claim 3, wherein the computer-executable instructions further cause the computer to:
   retrieve a number of hours corresponding to a next scheduled maintenance;
   determine a difference between the total engine hours value and the next scheduled maintenance number of hours; and
   display the difference.

5. The non-transitory computer-readable medium of claim 1, wherein the computer-executable instructions further cause the computer to determine the RPM based on an analysis, by the electronic device monitoring the electrical system, of a frequency of the electrical noise emitted by the one engine.

6. The non-transitory computer-readable medium of claim 1, wherein the computer-executable instructions further cause the computer to:
   analyze the electrical noise emitted by one of the one or more engines to determine a type of engine; and
   record the type of engine.

7. The non-transitory computer-readable medium of claim 1, wherein the computer-executable instructions that cause the computer to detect the electrical noise corresponding to the one or more engines starting or running comprise computer-executable instructions that cause the computer to detect the electrical noise on the electrical system, the electrical system being a direct current (DC) electrical system coupled to the one or more engines and a marine electronics device, and wherein the electrical noise is electromagnetic interference introduced to the DC electrical system by the one or more engines.

8. The non-transitory computer-readable medium of claim 1, wherein the computer-executable instructions that cause the computer to detect the electrical noise corresponding to the one more engines starting or running further comprise computer-executable instructions that cause the computer to disable an electrical noise filter.

9. The non-transitory computer-readable medium of claim 1, wherein the computer-executable instructions that cause the computer to display the engine runtime in association with the RPM on a display screen.

10. The non-transitory computer-readable medium of claim 1, wherein the computer-executable instructions further cause the computer to detect time periods where the one or more engines are idling by monitoring the electrical noise corresponding to the one or more engines.

11. The non-transitory computer-readable medium of claim 1, wherein the computer-executable instructions that cause the computer to detect the electrical noise corresponding to the one or more engines starting or running comprise computer-executable instructions that cause the computer to detect the electrical noise corresponding to a frequency signature of one of the one or more engines.

12. An apparatus for displaying marine electronic data, the apparatus comprising:
  one or more processors;
  a screen configured to display marine data; and
  memory having a plurality of executable instructions which, when executed by the one or more processors, cause the one or more processors to:
    detect, by an electronic device monitoring an electrical system, electrical noise emitted onto the electrical system via an electrical connection to the electrical system by one or more engines, the electrical noise corresponding to the one or more engines starting or running;
    record a first timestamp corresponding to the one or more engines starting or running in response to the detection of the electrical noise;
    analyze, by the electronic device monitoring the electrical system, the electrical noise emitted by one of the one or more engines to determine a revolutions per minute (RPM) corresponding to the one engine;
    store a record describing the RPM of the one engine while the one engine is running;
    detect, by the electronic device monitoring the electrical system, an absence of the electrical noise indicating that the one or more engines have stopped;
    record a second timestamp corresponding to the one or more engines stopping in response to the detection of the absence of the electrical noise on the electrical system; and
    determine engine runtimes based on the first and second timestamps.

13. The apparatus of claim 12, wherein the executable instructions further cause the processors to transmit the engine runtimes to a cloud software service.

14. The apparatus of claim 12, wherein the executable instructions further cause the processors to:
  retrieve a total engine hours value corresponding to one of the one or more engines; and
  add an engine runtime to the total engine hours value.

15. The apparatus of claim 12, wherein the executable instructions that cause the processors to detect the electrical noise corresponding the one or more engines starting or running comprise executable instructions that cause the processors to detect the electrical noise on the electrical system, the electrical system being a direct current (DC) electrical system and the electrical noise being electromagnetic interference introduced to the DC electrical system by the one or more engines.

16. A method for detecting engine hours, the method comprising:
  detecting electrical noise emitted onto the electrical system via an electrical connection to the electrical system by one or more engines, the electrical noise corresponding to the engine running, wherein the engine is connected to the electrical system, the electrical system being a direct current (DC) electrical system and the electrical noise is detected by a computerized device connected to the electrical system;
  monitoring, by the computerized device connected to the electrical system, the electrical noise to determine an amount of time that the engine is running;
  analyzing, by the computerized device connected to the electrical system, the electrical noise emitted by one of the one or more engines to determine a revolutions per minute (RPM) corresponding to the one engine;
  storing an RPM record describing the RPM of the one engine while the one engine is running; and
  storing an engine runtime record, on the computerized device, of the amount of time that the engine is running.

17. The method of claim 16, wherein monitoring the electrical noise to determine the amount of time that the engine is running comprises:
  detecting that the engine has started; and
  detecting that the engine has stopped.

18. The method of claim 16, further comprising:
  detecting time periods when the engine is idling; and
  storing a record describing the time periods when the engine is idling.

19. The method of claim 16, further comprising transmitting the record of the amount of time that the engine is running to a cloud software service.

20. The method of claim 16, further comprising displaying the RPM in association with information in the engine runtime record.

* * * * *

UNITED STATES PATENT AND TRADEMARK OFFICE
CERTIFICATE OF CORRECTION

PATENT NO. : 9,728,013 B2
APPLICATION NO. : 14/612925
DATED : August 8, 2017
INVENTOR(S) : Phillip King Gaynor Page 1 of 1

It is certified that error appears in the above-identified patent and that said Letters Patent is hereby corrected as shown below:

Claim 1, Column 10, Line 29, "determine an engine runtimes based on the first and" should read as the following: "determine an engine runtime based on the first and".

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*